United States Patent [19]

Dougherty

[11] Patent Number: 5,225,991
[45] Date of Patent: Jul. 6, 1993

[54] OPTIMIZED AUTOMATED MACRO EMBEDDING FOR STANDARD CELL BLOCKS

[75] Inventor: Dawn K. Dougherty, South Burlington, Vt.

[73] Assignee: International Business Machines Corporation, Armonk, N.Y.

[21] Appl. No.: 684,081

[22] Filed: Apr. 11, 1991

[51] Int. Cl.⁵ .............................................. G06F 15/60
[52] U.S. Cl. ................................. 364/491; 364/490; 364/489; 364/488
[58] Field of Search ................ 364/488, 489, 490, 491

[56] References Cited

U.S. PATENT DOCUMENTS

| | | | |
|---|---|---|---|
| 3,654,615 | 4/1972 | Freitag | 364/491 |
| 4,377,849 | 3/1983 | Finger et al. | 364/491 |
| 4,577,276 | 3/1986 | Dunlop et al. | 364/491 |
| 4,593,363 | 6/1986 | Burstein et al. | 364/491 |
| 4,630,219 | 12/1986 | DiGiacomo et al. | 364/491 |
| 4,686,629 | 8/1987 | Noto et al. | 364/491 |
| 4,815,003 | 3/1989 | Putatunda et al. | 364/491 |
| 4,839,821 | 6/1989 | Murakata | 364/491 |
| 4,849,904 | 7/1989 | Aipperspach et al. | 364/489 |
| 4,890,238 | 12/1989 | Klein et al. | 364/491 |
| 4,908,772 | 3/1990 | Chi | 364/491 |

OTHER PUBLICATIONS

"Theory and Concepts of Circuit Layout" by Hu et al.

Primary Examiner—Vincent N. Trans
Attorney, Agent, or Firm—J. Dennis Moore

[57] ABSTRACT

A standard cell macro embedding method that extends the capability of conventional circuit placement routines by enabling them to automatically and optimally embed macro blocks within standard cell blocks. The macro blocks can be selected portions of the standard cell logic that are extracted and optimized for the purpose of enhancing performance, low power, density or functionality. The present invention optimally places these macros using a two pass placement process in which, first, Anchor and, second, Structure Expansion models of the macro blocks are employed to, respectively, optimally locate the macro blocks, and then, optimally place the standard cells.

13 Claims, 3 Drawing Sheets

Fig. 1.

HERE q = 3

OPTIMIZED AUTOMATED MACRO EMBEDDING FOR STANDARD CELL BLOCKS

BACKGROUND OF THE INVENTION

1. Technical Field

The present invention relates to methods for automatically placing circuit elements in an arrangement suitable for placement on an integrated circuit chip, and more particularly relates to a method for expanding the capability of horizontal channel based placement algorithms to incorporate non-conforming circuit elements.

2. Background Art

In integrated circuit design, typically, thousands of transistors must be arranged in a limited space to provide some desired logical function. To assist designers in this process, placement methods have been developed and implemented in computer programs. One such placement method is the standard cell horizontal channel based placement method. According to this method, a library of standard cells is provided, each such cell containing a small group of transistors that together provide an elemental logical function, such as AND gate, OR gate, or the like. The logical designer utilizes these standard cells as building blocks in constructing the overall circuit that implements the larger logical function. The horizontal channel based placement algorithm takes this logical arrangement of standard cells that the logical designer has created and physically arranges them optimally in an area usually referred to as the Standard Cell Block that corresponds to the limited area available for placement on an area in the integrated circuit chip itself.

The standard cells are physically limited in height to a specific maximum. The horizontal channel based placement method utilizes a field comprising a stack of parallel limit lines defining a stack of rows, such limit lines having a minimum spacing equal to the specific maximum height of the standard cells, and arranges the cells within these rows.

Given a particular library of standard cells, there is typically a preferred implementation for certain critical path portions of the overall circuit that provides superior performance, density, low power or function. It may be desired, therefore, to prearrange the circuits for such critical path portions into fixed macro blocks, rather than rely on the standard cell implementation.

A problem, however, is that such macro blocks do not, in general, conform to the restrictions of the placement and routing algorithms applied to the standard cell block construction. In particular, the height of such macro blocks typically exceed by several multiples the specified standard cell maximum. Unmodified, such placement methods are simply unable to handle these macro blocks.

Several approaches have been discussed for modifying the standard cell placement method to permit its use in conjunction with circuit portions preconfigured as macro blocks. For example, B. Korte, et al., in "Combining Partitioning and Global Routing in Sea-Of-Cells Design" ICCAD/IEEE Proceedings, p. 98 (1989), discuss an approach which utilizes partitioning and global routing in a type of horizontal channel based placement method known as Sea-Of-Cells design. According to the approach disclosed in this article, the macro blocks are prepositioned and fixed at certain locations within the standard cell blocks, and the remaining area of the block is partitioned into regions to which the standard cells are assigned. The standard cells are then placed within their assigned regions using a Sea-Of-Cells placement method. While this approach does result in the mixed placement of macros and standard cells with Sea-Of-Cells placement methods, a disadvantage is that the macro blocks are not optimally placed with respect to the surrounding standard cells.

Another approach is discussed by M. Upton, et al, in "Integrated Placement for Mixed Macro Cell and Standard Cell Designs," 27th ACM/IEEE Design Automation Conference, p. 32 (1990). According to this approach, the standard cells are partitioned into blocks using a known minimum net-cut method, and then these blocks, along with the macro blocks, are placed using a simulated annealing optimization method. Then, a simple simulated annealing method is used to place the standard cells within the blocks. This approach has an advantage over the Korte, et al. approach in that the macro blocks are placed in optimized locations within the standard cell block. However, a disadvantage of this approach is that it is quite complex, resulting in the use of considerable time in deriving an implementation as well as resulting in considerable CPU time in executing such implementation.

A third approach is disclosed by A. DiGiacomo, et al., in U.S. Pat. No. 4,630,219, commonly assigned, which issued on Dec. 16, 1986. According to the method disclosed in this patent, the overall circuit is partitioned into blocks, including the macro blocks. A three pass process is then applied to these resulting elements. In the first pass, all of the elements are treated as if they are the same size, are assigned to element positions, and their placement is optimized. In the second pass, these unit size elements are replaced by macro size elements which are approximately the actual size of the corresponding electronic elements. The macro size elements are then rearranged for optimal placement on a macro model image, taking their sizes and shapes into account. Finally, the macro size elements are replaced by actual size elements, and their placement is again optimized. In this method, as in the previous method, the macro blocks are placed according to a method designed to optimize their position. However, it is desired to have a simpler method to permit the utilization of macro blocks with horizontal channel based placement methods.

Other U.S. Patents disclosing approaches to integrated circuit placement which contain large circuit blocks are as follows:

U.S. Pat. No. 4,908,772, issued to M. C. Chi on Mar. 13, 1990, and assigned to Bell Telephone Laboratories, discloses a placement method which involves global partitioning of standard cells into clusters that are then placed among the macro blocks.

U.S. Pat. No. 4,890,238, issued to K. Klein, et al., on Dec. 26, 1989, commonly assigned, discloses a method for physical chip design that also utilizes the technique of global partitioning and arranging.

U.S. Pat. No. 4,593,363, issued to M. Burstein, et al., on Jun. 3, 1986, and commonly assigned, discloses a placement method that also utilizes the technique of partitioning.

U.S. Pat. No. 4,577,276, issued to A. E. Dunlop, et al, on Mar. 18, 1986, and assigned to AT&T Bell Laboratories, discloses a placement method that also uses partitioning.

It is thus an object of the present invention to provide a method for automatically and optimally embedding macro blocks in a horizontal channel based placement method implemented in a computer program without the need for manual edge placement and without the need to partition.

It is a further object to provide such a method for embedding a plurality of macro blocks within a standard cell circuit structure.

It is a still further object of the invention to provide such a method that can be implemented in a relatively simple and straightforward manner.

SUMMARY OF THE INVENTION

These and other objects are accomplished by the method of the present invention which operates in a global placement system for a circuit array, the array being built up from a set of circuit elements having an elemental logic function and a predetermined physical size, such as standard cells, wherein the circuit elements are optimally placed in a semiconductor chip circuit area by a process of defining a field of parallel limit lines having a minimal spacing therebetween determined by the tallest circuit element in the set, and placing and optimally arranging such circuit elements along these limit lines. The present invention provides a method for optimally embedding a predetermined circuit arrangement, such as a circuit macro, having a physical height larger than the minimum spacing between the limit lines. According to the invention, a first field filler is defined for the predetermined circuit arrangement. This first field filler has a width substantially the same as the width of the circuit arrangement, and a height no greater than the minimum spacing between the limit lines. A process of placing and optimally arranging the circuit elements, including the first field filler, is then performed. Then, further field fillers are added to the first field filler to define an aggregate field filler having an area substantially the same as the area of the predetermined fixed circuit arrangement. The aggregate field filler is then fixed in position in the chip circuit area so that it cannot be moved in the next step. Finally, at least some of the circuit elements in the field are replaced and rearranged to account for the fixed position aggregate field filler.

Thus, the present invention achieves optimal placement of both standard cells and the macro blocks within a chip circuit area, and does so by embedding the macro blocks within a standard cell placement area. The method can be used in conjunction with existing placement algorithms, and is substantially independent of the cost function implemented by such placement algorithms. Finally, application of the method only requires a two pass implementation, and thus represents a simplification as compared with prior art approaches.

DETAILED DESCRIPTION OF THE PREFERRED EMBODIMENTS

As the preferred embodiment of the present invention is advantageously adapted to be included as a modification to existing standard cell placement methods and their implementing computer programs, the following description, first, provides necessary background concepts concerning such placement procedures and, second, then teaches the principals by which the preferred embodiment of the present invention is incorporated into such procedures.

The principles of the preferred embodiment, described below in detail, can be used by those of ordinary skill in the art to supplement any placement program, of which there are presently a number available and in use, that employs the basic standard cell placement principles described below. For example, Min-Cut and simulated annealing placement routines are widely used in placement programs currently. The preferred embodiment described below is readily implemented for use in these programs, once the principles described herein are understood. Hereinafter, such placement programs are referred to simply as the "placement algorithm", or the "standard cell placement algorithm".

Figure 1:
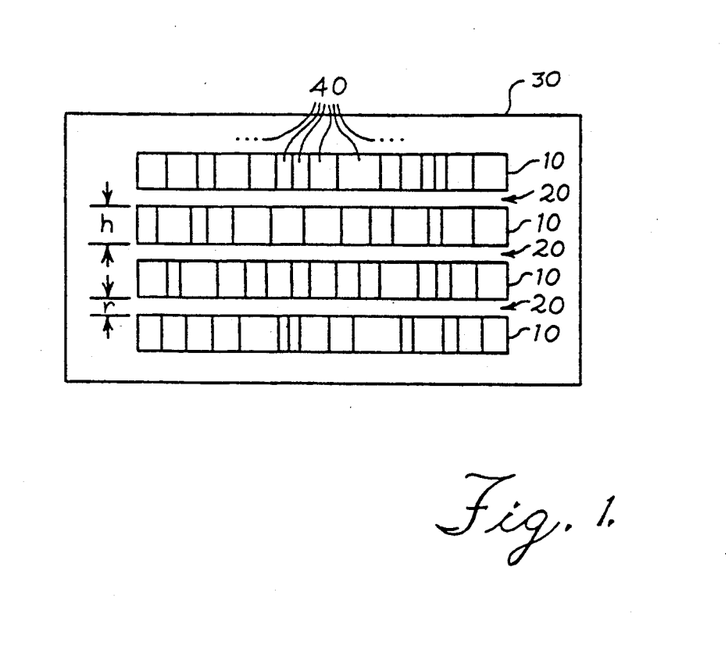
FIG. 1 is a diagram showing the basic elements of a Standard Cell Block area.

The standard cell placement algorithm optimally arranges a given set of standard cells, of common maximum height (h) and variable width (N) in the Standard Cell Block area. FIG. 1 is a representative diagram showing typical standard cell placement rows 10 and routing channels 20 in a standard cell block area 30. The block area 30 is divided into rows 10 which define the cell 40 placement locations (FIG. 1).

The placement algorithm requires that the cells be contained within the limit lines defined by the rows. Thus, the row height equals the cell height maximum, h. Normalizing, with h=1, the overall function achieved by the preferred embodiment is the optimal placement of an NxM macro, M being the height of the macro, which in general is greater than 1, in this Nx1-limited placement environment of area 30. The embodiment 1) defines an optimal location of the macro and standard cells with respect to each other, 2) handles the integration of macro levels, routing levels, power levels and global pass through routing levels, and 3) accounts for power concerns of both the macro and the standard cells.

The height, r, of the routing channels 20 is typically defined for the purpose of wire routing. The preferred embodiment has been applied in design environments where r>0 and r=0. In a recent application of the principles herein, three levels of wiring were available, thus eliminating the need for a routing channel. The algorithm is also easily adapted to variable height routing channels, as will be made apparent below.

As is known, cells are connected by a defined set of interconnects frequently referred to as nets. The cell connection points, or terminals, are typically referred to as pins. The standard cell blocks are constructed using a predesigned custom library containing such circuits as NAND, NOR, XNOR and latches. A fixed power distribution network typically runs the full height of the Standard Cell Block.

Figure 2:
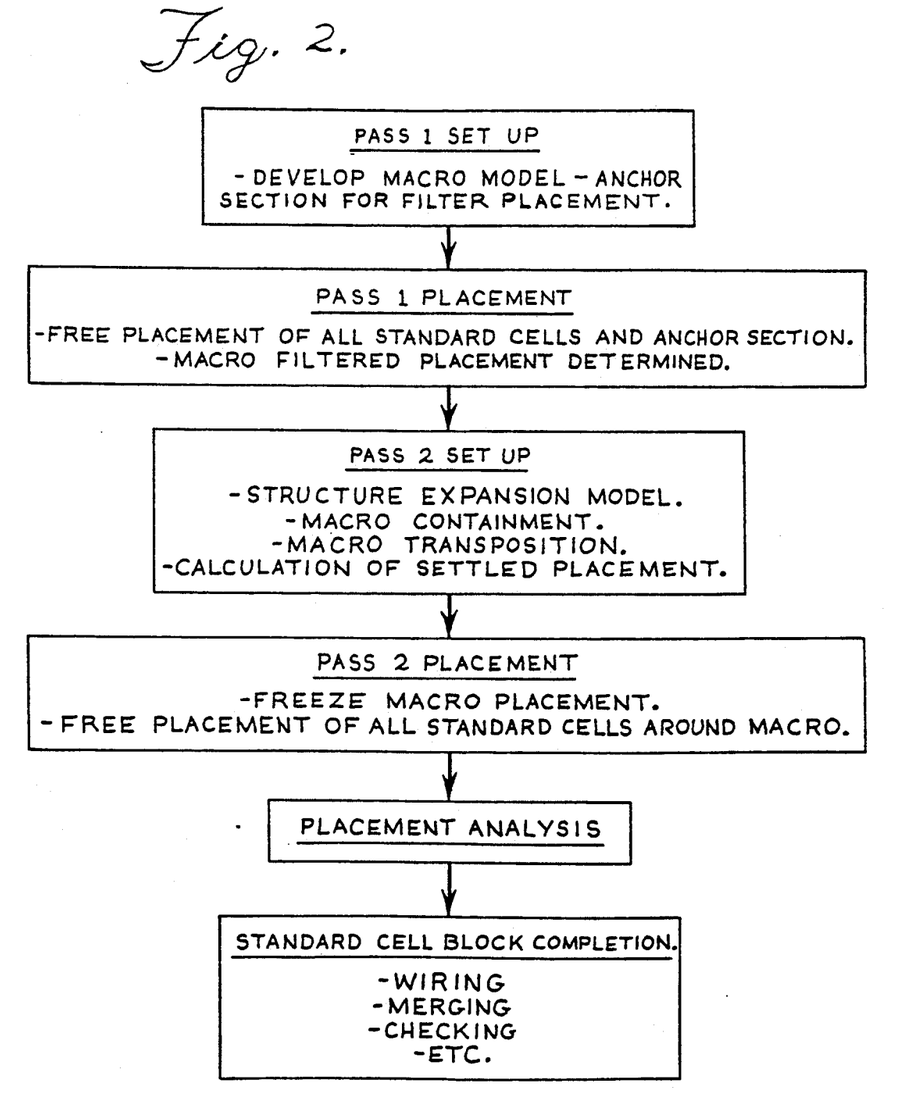
FIG. 2 is a flow chart of the preferred embodiment of the present invention.

The embedding algorithm utilized in the preferred embodiment employs a modeling sequence and a two pass placement process. The algorithm flow is shown in FIG. 2.

Figure 3:
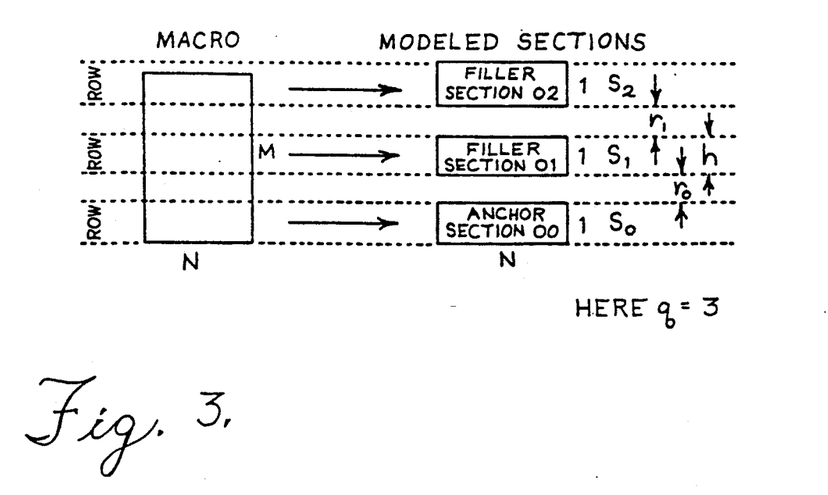
FIG. 3 is a diagram showing a typical macro and its representative field fillers.

The macro block is divided into q, Nx1 filler sections. As shown in FIG. 3, each section, $S_i$, has a height equal to the defined cell height maximum (h) and an Adjusted Macro Width, which is the original macro width plus an additional factor, described below in more detail. The first placement pass determines an initial optimal macro location using a placement algorithm on the Anchor model which consists of a single ANCHOR FILLER section to model the macro origin. This is referred to as the Filtered Placement since all elements are optimally placed by the placement algorithm, but the macro is modeled by the $S_o$ section and its final exact placement is not yet determined.

Once the Filtered Placement is determined, the entire macro is modeled by the "Structure Expansion" model which is composed of the ANCHOR FILLER section and additional ADD FILLER sections. A macro's height will typically consume a total of 3-4 row heights. The composite of the ANCHOR and ADD FILLER sections represent the entire NxM macro area. Thus, the macro cell area, MA, is defined as $$MA = \sum_{i=0}^{(q-1)} S_i + \left( \sum_{i=0}^{(q-2)} r_i \right) * N_{macro}$$

With r = 0, MA is simply:

$$MA = \sum_{i=0}^{(q-1)} (S_i)$$

The Filtered Placement coordinates and the Structure Expansion model are used to check for containment of the macro within the Standard Cell Block area and overlap of multiple embedded macros. Transposition of critical macro information (such as pin placement, open routing channels and routing blockages) then occurs from the coordinate system of the macro to that of its filler sections. Finally, macro sections are "glued" together, or fixed, at a Settled Placement which is determined by 1) the Filtered Placement 2) macro and standard cell block boundaries 3) power considerations of both the standard cell block and embedded macros and 4) the global wiring effects in a manner described in detail below. The Standard Cell Block is then wire routed, conventionally. The model sections are then deleted and the real macro is merged at the ANCHOR FILLER section's final Settled Placement coordinates. It will be apparent that section modeling in this manner provides a way to model the macro so that conventional optimizing placement programs can be applied.

Figure 4:
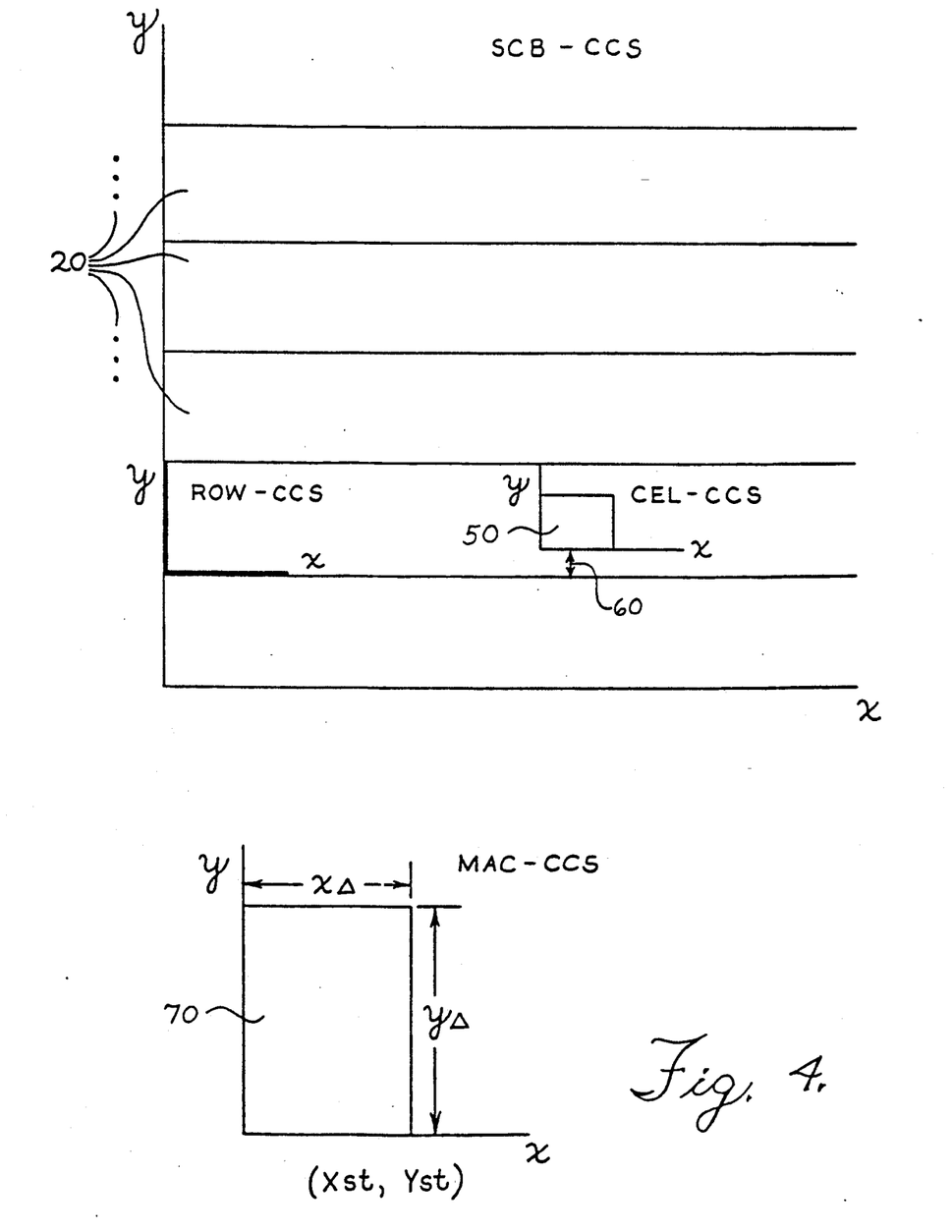
FIG. 4 is a diagram showing the coordinate systems used in the preferred embodiment.

For implementation of the preferred embodiment, a four tiered cartesian coordinate system (CCS) is configured, as shown in FIG. 4, which consists of a Cell coordinate system (CEL_CCS), a Row coordinate system (ROW_CCS), a Standard Cell Block coordinate system (SCB_CCS) and a macro coordinate system (MAC_CCS).

The row coordinate system is internal to its associated row, has a common x axis with the SCB coordinate system and a y axis shifted with respect to the SCB coordinate system to the bottom of its associated row, as shown. The cell coordinate system is internal to its associated cell 50, wherever placed.

In some conventional standard cell systems the cell origin may be offset from the rows and thus a small y offset, 50, may be specified. If the y offset is equal to 0 then the CEL_CCS is equal to the ROW_CCS. It is assumed hereinbelow that this y offset is equal to 0. Also note that ROW and section numbering begin at 0. The x and y origin coordinates are referred to as X start, or $x_{st}$, and y start, or $y_{st}$, respectively.

The macro coordinate system is internal to its associated macro 70, and is transposed, as described below, to a cell coordinate system associated with the macro's corresponding FILLERS.

These coordinate systems are established for the modeling sequence.

The computer code routine implementing the preferred embodiment is presented below in pseudo-code form, along with a description of the principles and function of the code. As is well known, pseudo-code is readily converted into computer instructions in a wide variety of languages.

Pass 1 setup

The macro is modeled in Pass 1 by an ANCHOR FILLER section which has a height h and has an Adjusted Macro Width. The model width may need to be adjusted if the standard cells are overlapped for power bussing and/or to correct layout rule violations that would occur because of the macro embedding. A Macro Offset Factor (MOF) is used to adjust the Filler selection's width and x start definitions. If no adjustment is necessary, MOF is equal to 0. The width ($MAC_x$) and x start ($MAC_{xst}$) are defined in the macro coordinate system (MAC_CCS) and are adjusted as follows:

MOF = the required offset adjustment.
$MOF_{tot}$ = MOF * 2
$MAC_{xst}$ = $MAC_{xst}$ − MOF
$MAC_x$ = $MAC_x$ + $MOF_{tot}$ These values need not be transposed to the CEL_CCS or ROW_CCS since the standard cell widths are not restricted.

Pass 1 Placement: Filtered Placement determination

In this placement pass, all cells are freely placed using the placement algorithm. The macro ANCHOR FILLER section has been added tot he standard cell library and is used to model the macro origin. The resulting Filter Placement is optimal for the standard cells and ANCHOR FILLER based on interconnection needs. The Filtered Placement coordinates are $FILTER_{xst}$, $FILTER_{yst}$ in the SCB_CCS.

Pass 2 setup

For Pass 2, a Structure Expansion model is generated which incorporates the remainder of the macro with ADD FILLER sections (also having height h and adjusted width). These join the ANCHOR FILLER to model the entire macro. The macro Filtered Placement coordinates are adjusted to give a macro Settled Placement, the coordinates of which are $SETTLE_{xst}$ and $SETTLE_{yst}$, and which are fixed prior to Pass 2 placement, below. $SETTLE_{xst}$ and $SETTLE_{yst}$ are initialized to $FILTER_{xst}$ and $FILTER_{yst}$, respectively, prior to making the following adjustments.

Macro containment

Containment of the macro in the Standard Cell Block (SCB) is determined using Row Consumption Calculations. To place the macro, the ANCHOR FILLER section is given the initialized SETTLE$_{yst}$ value. The ADD FILLER sections are then stacked above the ANCHOR FILLER. This presents the possibility of overhanging the Standard Cell Block y bound. A check is therefor performed as shown below.

```
TOPMACy = SETTLE_yst + MAC_y - 1
TOPSCBy = SCB_yst + SCB_y - 1
If TOPMACy > TOPSCBy then OVERHANG = TRUE
```

To correct for overhand, an array is established which provides row numbers and corresponding y start values. The row yst values are given in the SCB_CCS. If row mirroring is used for nwell sharing, the non mirrored coordinates are applied. The ANCHOR FILLER section is usually not mirrored since there is no benefit for a macro and the merging occurs at these coordinates. The row number in which the ANCHOR FILLER is placed is determined:

```
ROW# = 1
Search
    If SETTLE_yst = ROW'_yst (ROW#)
    Then ANCROW = ROW#
    Else ROW# = ROW# + 1
Until found
where ANCROW = the row that the anchor section is placed in.
If overhang occurs, the macro yst is moved down in row
increments.
    i = (ANCHOR - 1)
        this moves the ANCHOR FILLER down 1 row
        (including routing channels) if overhang.
While (TOPMACy > TOPSCBy) and (i > = 0) Do
    SETTLE_yst = SETTLE_yst - (h_i + r_i)
        assigns the yst of the ANCHOR down one row
    i = i - 1
    TOPMACy = SETTLE_yst + MAC_yΔ - 1
end While
```

A new anchor row number, ANCROW, is then assigned based on the current value of SETTLE$_{yst}$.

Check for Overlap

Given two macros, A, and B, with the following definitions:

```
AB_xlo = X_st value of A
A_xhi = X_st + Δx-1 value of A
A_ylo = Yst value of A
A_yhi = the Yst + Δy-1 value of A
B_xlo = the Xst value of B
B_xhi = the Xst + Δx-1 value of B
B_ylo = the Yst value of B
B_yhi = the Yst + Δy-1 value of B.
```

If the x ranges of A and B and the y ranges of A and B overlap, then overlap of the two macros exists. This is determined by the following:

```
AB_lhx = Axlow - Bx_high
BA_lhx = Below - Ax_high
If AB_lhx < 0 and BA_lhx < 0 then OVERLAP in
x = TRUE
Then checking the y range gives
AB_lhy = A_ylow - B_yhigh
BA_lhy = B_ylow - A_yhigh
If AB_lhy < 0 and BA_lhy < 0 then OVERLAP in
y = TRUE
Finally if OVERLAP in y = TRUE and OVERLAP in
x = TRUE then overlap of macro A & B = TRUE.
```

Adjustments may be made in the x or y direction, usually, depending on the minimum movement distance required. Either adjustment requires a check for containment in the corresponding directions. It will be readily apparent to those skilled in the art that this containment is performed in a manner similar to the macro containment described in the preceeding section, however, the checking and adjustment must be done additionally as against the x upper and lower bounds, and the y lower bound, in addition to the y upper bound.

Macro sectioning

The total number of sections, q, required to model the entire macro is determined below. This number represents the sum of the ANCHOR FILLER and ADD FILLER sections. This calculation occurs in SCB_CCS. For the case of r=0 the calculation is simply;

$$q = \text{int}(MAC_{yΔ}/h)$$
$$\text{if mod} > 0 \text{ then } q = q + 1$$

If the macro overlaps a partial row then that entire row is added to the Structure Expansion model. The extra space above the macro may be used for routing.

The code for the cases r>0 or variable r<R=(r$_1$, r$_2$, ... r$_i$) routing channel heights is more complicated and is shown below. The process starts at the bottom of the macro (ANCHOR FILLER section) and counts the sections as it moves up the macro. The ANCROW and TOPMACy are calculated as in Macro Containment section.

```
MACHT = Top y location of the macro model; initialize
        to = SETTLE_yst + (h - 1).
i = Row# of top section- initialize to ANCROW.
q = number of sections- initialize to 1 since begin with
    ANCROW.
While MACHT < TOPMACY Do
    MACHT = MACHT + h + r_i
    i = i + 1
    q = q + 1
end while
Upon exit, q contains the number of sections and i has
the top y location
```

Macro transposition

Cell coordinate systems are assigned to each of the FILLER sections comprising the Structure Expansion model. Critical macro information is transposed from the original macro coordinate system to these coordinate systems for wiring concerns. The y coordinates of the pins and wiring-passthroughs (OPENs) are calculated for their location in the macro sections. The x locations remain the same. Transposition occurs from the undefined (to the placement algorithm) macro coordinate system (MAC_CCS) to the defined CEL_CCS.

Pin y location (PIN$_{yloc}$)

Pins are moved from a y location in the macro to a corresponding y location in the appropriate macro section.

```
Do
    PINSEC = section # (i, of Si) that the pin is
            located in.
    BELOWPIN = space (MAC_CCS) in rows below pin
            = PINSEC * h.
    PININSEC = location (ROW_CCS) of pin in its
            section = PININMAC - BELOWPIN
For all pins
For r < > 0 the BELOWPIN value is calculated as
follows:
```

-continued $$BELOWPIN = \sum_{i=0}^{pinsec-1} (r_i + h_i)$$

Open y locations (OPENs$_{yloc}$)

OPEN statements specify regions in the cell area that are "open", that is, free to routing. These passthrough areas provide reduced wiring congestion.

Using the number of sections determine the section y bottom location (SECyBOT) and section y top location (SECyTOP) for each section. These are represented in the SCB_CCS.

```
Section # = SEC# = 0
  SECyBOT(SEC#) = MAC_ystR
  While SEC# < (q - 1) Do
  SEC# = SEC# + 1
    SECyBOT(SEC#) = MAC_yst + (SEC# - 1) * h + r_(sec#-1)
  end
```

Set up an array of SECyTOP values for each section based on the SECyBOT values.

```
SEC# = 0
While SEC# = (q - 1)
  SECyTOP(SEC#) = SECyBOT(SEC#) + h - 1
SEC# = SEC# + 1
end
```

Transpose the Y coordinates of the OPEN statements with a defined X, and a given Y range (FROM/TO).

```
Repeat Until SEC# = (q - 1)
If Y_from > = SECyBOT(SEC#) & < = SECyTOP(SEC#)
Then
  Y_from = Y_from - SECyBOT(SEC#)
  Y_to = Y_to - SECyBOT(SEC#)
  If Y_to > h - 1
  Then
    Y_to = h - 1
    Write new open record to go into next hightler
    section (SEC# + 1) with:
      Y_from = SECyBOT(SEC# + 1)
      Y_to = Y_to - h
  Add open statements for wiring levels not utilized by
  the macro.
  SEC# = SEC# + 1
  end repeat
```

Calculation of final macro SETTLED Placement, (SETTLExst, SETTLEyst)

To this point, the macro containment and overlap adjustments have been applied to adjust the SETTLE$_{xst}$ and Yst values. Additional circumstances which may result in further adjustments are shown below. Once the final xst and yst values are determined, they are fixed so that their position is frozen for Pass 2 placement.

SETTLE$_{xst}$

Power bus locations, predefined global wiring and Standard Cell Block power distribution values are used to give the final SETTLE$_{xst}$ placement.

POWER BUS

A check must be done for power bus location due to the possible presence of restricted wiring levels used in the macro. An Illegal Wiring Zone (IWZ) in the macro is defined. This zone (in the CEL_CCS) is checked for overlap or minimum separation violation with the Power bus structure (SCB_CCS).

```
BI_LH = BUS_x_low - IWZ_x_high
PI_LH = IWZ_low - BUS_x_high
IF BP_LH MINSEP and PB_LH < MINSEP
Then OVERLAP occurs
Calculate overlap shift factor and shift macro
  OVLAPSHFT = BP_1h - MINSEP OR PB_1h - MINSEP
  Xst = Xst +/- OVERLAP
Where
  BU_x_low = the lower x bound of the power bus
  BUS_x_high = the upper x bound of the power bus
  IWZ_x_high = the upper x bound of the IWZ
  IWZ_x_low = the lower x bound of the IWZ
  MINSEP = the minimum separation of the IWZ and
    power bus.
```

PREDEFINED GLOBAL WIRING

The macro IWZ is also checked against the predefined global wiring for minimum sepation violation using a similar procedure to that used to check the power bus described above.

STANDARD CELL BLOCK POWER DISTRIBUTION

Occasionally the placement of multiple macros may cut off a small section of the SCB cells from power. This occurs if a y overlap of the macros exists where a power bus does not exist within the x range between the two macros. This is easily corrected by macro shifting or power strapping.

SETTLE$_{xst}$

The section's SETTLE$_{yst}$ value must be calculated such that the origins are placed on a row's YSPINE. The YSPINE is the location in the row where the cells are placed. It is offset from the row's yst value by a y offset (YSPINE ). This value has been considered to be 0 to this point. Extra filler space is a case where a non-zero YSPINE is significant. In the row definition the YSPINE location is given in ROW_CCS. For the fixed Settled Placement, the YSPINE must be given in SCB_CCS.

It was noted above that if a macro overlaps any fraction of a row, that entire row height is modeled. This presents the possibility that extra space may remain after the placement is completed. The YSPINE can be used to shift the actual placement of the YSPINE and, thus, the cell on the row. This can therefore be used to move the macro in the y direction within the space reserved by the Structure Expansion model such that the extra space is redistributed to reduce wiring congestion. The offset is applied to the ANCHOR FILLER yst, since the actual macro is merged at this point.

Pass 2 Placement: Settled Placement

Settled placement is run with fixed macro sections with all of the standard cells being placed around the macro FILLER sections. Thus, the standard cells are optimally placed around the Structure Expansion model.

While the present invention has been particularly shown and described with reference to the preferred embodiments thereof, it will be understood by those skilled in the art that changes in form and details may be made without departing from the spirit and scope of the invention.

I claim:

1. In a data processing system, a method for automatically arranging the circuits of a circuit array for placement in a semiconductor chip circuit area, the array being built up from a set of circuit elements, having an elemental logic function and a predetermined maximum spatial extent in at least one dimension, that are placed and arranged in a field corresponding to the circuit area, and for automatically embedding a predetermined circuit arrangement having a physical extent in said one dimension larger than the predetermined maximum spatial extent, comprising the steps of;

providing a first field filler for the predetermined circuit arrangement, having a spatial extent in said one dimension no larger than the predetermined maximum spatial extent;

placing and arranging said circuit elements and said first field filler in said field according to a predetermined algorithm;

after arranging the circuit elements, providing at least one further field filler adjacent to said first field filler to define an aggregate field filler having an area substantially the same as the area of the predetermined circuit arrangement;

fixing the position in the field of said aggregate field filler so that it cannot be moved in the next step; and then     replacing and arranging at least some of said circuit elements in said field to account for said fixed position aggregate field filler.

2. In a data processing system executing a circuit placement program for a circuit array, the array being built up from a set of circuit elements having an elemental logic function and a predetermined physical size, wherein the circuit elements are placed in a semiconductor chip circuit area by a process of defining, in an area corresponding to the chip circuit area, a field of parallel limit lines having a minimal spacing therebetween determined by the tallest circuit element in the set, and placing and arranging such circuit elements along such limit lines, a method for automatically embedding a predetermined circuit arrangement having a physical height larger than the minimum spacing between the limit lines, comprising the steps of:

defining a first field filler for the predetermined circuit arrangement, having a width substantially the same as the width of the arrangement and a height no greater than said minimum spacing between the limit lines;

placing and arranging the circuit elements and said first field filer along said limit lines according to a predetermined algorithm;

after performing said step of placing and arranging, providing further field fillers to said first field filler to define an aggregate field filler having an area substantially the same as the area of the predetermined circuit arrangement;

fixing the position in the field of said aggregate field filler so that it cannot be moved in the next step; and     replacing and arranging at least some of the circuit elements along said limit lines to account for said fixed position aggregate field filler.

3. In a data processing system, a method for automatically arranging the circuits of a circuit array for placement in a semiconductor chip circuit area, the array being built up from a set of circuit elements having an elemental logic function and a predetermined physical size, and for automatically embedding a predetermined circuit arrangement having a physical height larger than the minimum spacing between the limit lines, comprising the steps of;

providing, in an area corresponding to the chip circuit area, a field of predefined parallel limit lines having a minimal spacing therebetween determined by the tallest circuit element in the set;

providing a first field filler for the predetermined circuit arrangement, having a width substantially the same as the width of the arrangement and a height no greater than said minimum spacing between the limit lines;

placing and arranging said circuit elements and said first field filler along said limit lines according to a predetermined algorithm;

after arranging the circuit elements and said first field filler, providing further field fillers adjacent to said first field filler to define an aggregate field filler having an area substantially the same as the area of the predetermined circuit arrangement;

fixing the position in the field of said aggregate field filler so that it cannot be moved in the next step; then     placing and arranging said circuit elements along said limit lines according to said predetermined algorithm;

substituting said predetermined circuit arrangement for said aggregate field filler; and     placing wires to interconnect said cells and said predetermined circuit arrangement.

4. A method according to claim 3 wherein said steps of providing a first field filler and of providing further field fillers are performed by defining said fillers such that their width is greater than that of said circuit arrangement by a predetermined amount to accommodate circuit layout ground rule requirements.

5. A method according to claim 4 wherein said field is provided with a field coordinate system for characterizing locations therein, said field coordinate system having an axis parallel to said limit lines, and said fillers are each provided with a local coordinate system for characterizing locations therein, said local coordinate system having an axis parallel to said limit lines, wherein said step of defining said fillers comprises the steps of:

shifting the start point of the filler in the direction of said axis, within said local coordinate system by a desired amount; and     expanding the filler in width by said predetermined amount.

6. A method according to claim 3 wherein said step of placing said circuit elements along said lines further comprises the step of defining areas within said aggregate field filler within which wiring that connects elements external to the circuit arrangement is permitted to pass.

7. A method according to claim 6 wherein said step of defining comprises the steps of:

identifying available wiring channels within the circuit arrangement; and     characterizing said channels with respect to a coordinate system referenced with respect to said field.

8. A method according to claim 3 further comprising the following steps to be performed after said step of adding further field fillers and before said step of fixing the position of said aggregate field filler:

determining whether said aggregate field filler extends beyond the boundaries of said field, and if so, moving said aggregate filler so that it does not so extend.

9. A method according to claim 8 wherein said step of determining whether said aggregate field filler extends beyond the boundaries comprises the steps of:
characterizing the top boundary of said aggregate field filler with respect to a coordinate system referenced to said field,
characterizing the top boundary of said field with respect to said coordinate system; and
comparing said respective top boundaries so characterized.

10. A method according to claim 9 wherein said step of moving said aggregate filler so that it does not so extend comprises the steps of:
moving, if the result of said step of comparing is that said aggregate filler is outside the boundary of said field, said aggregate field filler origin in a direction perpendicular to said limit lines inward to the next limit line; and
repeating the step of characterizing the top boundary of said aggregate field filler, said step of comparing and said step of moving said aggregate field filler origin, until said aggregate field filler is no longer outside the boundary of said field.

11. A method according to claim 10 wherein:
said step of providing limit lines is performed by providing said limit lines such that selected limit lines are spaced apart from an adjacent limit line by a predetermined amount greater than said minimum spacing, which predetermined amount need not be the same for any two such spacings; and
said step of providing further field fillers is performed by providing such field fillers having a height corresponding to the combined row spacings which the area of the predetermined circuit arrangement overlaps when its origin is the same as the origin of the first field filler.

12. A method according to claim 11 wherein said step of providing further field fillers comprises the steps of:
determining whether said aggregate field filler extends beyond the top boundary of said field;
for the portion of said aggregate field filler so extending, providing further field fillers having a height substantially the same as said minimum spacing; and then
moving said aggregate field filler to a position that avoids such extension beyond the top boundary of said field.

13. A method according to claim 3, wherein the method for embedding a predetermined circuit arrangement includes a method for embedding a plurality of such arrangements, and wherein said step of providing further field fillers comprises the steps of:
determining whether any two or more of such aggregate fillers overlap; and if so
moving one or more of such aggregate fillers to eliminate such overlap.

* * * * *